_US005719974A_

United States Patent [19]

Kashyap

[11] Patent Number: 5,719,974
[45] Date of Patent: Feb. 17, 1998

[54] METHOD FOR CUSTOMIZING OPTICAL DEVICE CONFIGURATION AFTER PACKAGING AND PACKAGED OPTICAL DEVICE FOR USE THEREWITH

[75] Inventor: Raman Kashyap, Ipswich, United Kingdom

[73] Assignee: British Telecommunications public limited company, London, England

[21] Appl. No.: 500,896

[22] PCT Filed: Jan. 31, 1994

[86] PCT No.: PCT/GB94/00180

§ 371 Date: Aug. 1, 1995

§ 102(e) Date: Aug. 1, 1995

[87] PCT Pub. No.: WO94/17448

PCT Pub. Date: Aug. 4, 1994

[30] Foreign Application Priority Data

Jan. 29, 1993 [EP] European Pat. Off. .............. 93300682

[51] Int. Cl.[6] .................................. G02B 6/34; G02B 6/42
[52] U.S. Cl. .................................................. 385/37; 385/90
[58] Field of Search ............................. 385/1, 4, 10, 37, 385/88–94; 372/96, 102; 356/350; 250/239

[56] References Cited

U.S. PATENT DOCUMENTS

| 4,119,363 | 10/1978 | Camlibel et al. | 385/84 |
|---|---|---|---|
| 4,270,134 | 5/1981 | Takeda et al. | 257/99 |
| 4,286,232 | 8/1981 | Puech et al. | 385/88 X |
| 4,646,142 | 2/1987 | Levine | 250/239 X |
| 4,893,901 | 1/1990 | Taumberger | 359/894 |
| 4,906,065 | 3/1990 | Taumberger | 385/14 |
| 5,142,595 | 8/1992 | Chester | 385/37 |
| 5,218,655 | 6/1993 | Mizrahi | 385/37 X |
| 5,258,626 | 11/1993 | Suzuki et al. | 505/181 |
| 5,287,302 | 2/1994 | Brandelik et al. | 365/161 |
| 5,371,592 | 12/1994 | Beckwith et al. | 356/350 |

FOREIGN PATENT DOCUMENTS

| 0308748 | 9/1988 | European Pat. Off. . |
|---|---|---|
| 0300590 | 1/1989 | European Pat. Off. . |
| 0308748 | 3/1989 | European Pat. Off. . |

OTHER PUBLICATIONS

Hill et al, "Photosensitivity in Optical Fiber Waveguides: Application to Reflection Filter Fabrication", Applied Physics Letters, vol. 32, No. 10, 15 May 1978, New York US, pp. 647–649.

Hill et al, "Efficient Mode Conversion in Telecommunication Fibre Using Externally Written Gratings", Electronics Letters, vol. 26, No. 16, 2 Aug. 1990, Stevenage, GB, pp. 1270–1272.

Bird et al, "Narrow Line Semiconductor Laser Using Fibre Grating", Electronics Letters, vol. 27, No. 13, 20 Jun. 1991, Stevenage, GB, pp. 1115–1116.

Meltz et al, "Formation of Bragg Gratings in Optical Fibers by a Transverse Holographic Method", Optics Letters, vol. 14, No. 15, 1 Aug. 1989, Washington US, pp. 823–825.

(List continued on next page.)

Primary Examiner—John D. Lee
Attorney, Agent, or Firm—Nixon & Vanderhye P.C.

[57] ABSTRACT

A method of assembling a package including a photosensitively configured optical device providing a window positioned to allow optical frequency electromagnetic radiation from an external source to impinge on a photosensitive part of the optical device. In one embodiment a packaged intermediate product is fabricated, which may subsequently be formed into an external cavity semiconductor laser having certain specified characteristics, by writing a grating into a photosensitive fiber. Use of a window allows the characteristics of the laser to be defined after packaging so that, firstly a large stock of external cavity lasers having all possible characteristics need not be held, and secondly so that the reflectivity of the grating need be chosen only once the degree of coupling between the fiber and the laser diode has been established, thus enhancing the performance of the external cavity laser.

30 Claims, 3 Drawing Sheets

OTHER PUBLICATIONS

Kashyap et al, "All–Fibre Narrowband Reflection Gratings at 1500 nm", Electronics Letters, vol. 26, No. 11, 24 May 1990, Stevenage GB, pp. 730–732.

Park et al, "Intermodal Coupler Using Permanently Photo-induced Grating in Two–Mode Optical Fibre", Electronics Letters, vol. 25, No. 12, 8 Jun. 1989, Stevenage GB, pp. 797–799.

Maxwell et al, "UV Written 1.5µm Reflection Filters in Single Mode Planar Silica Guides", Electronics Letters, vol. 28, No. 22, 22 Oct. 1992, Stevenage GB, pp. 2106–2107.

Sugita et al, "Laser–Trimming Adjustment of Waveguide Birefringence in Optical FDM Components", IEEE Journal on Selected Areas in Communication, vol. 8, No. 6, Aug. 1990, New York US, pp. 1128–1131.

Patent Abstracts of Japan, vol. 15, No. 446 (P–1274), 13 Nov. 1991 & JP,A,03 186 808 (Hitachi Cable Ltd), 14 Aug. 1991.

Kashyap et al, "Laser–Trimmed Four–Port Bandpass Filter Fabricated in Single–Mode Photosensitive Ge–Doped Planar Waveguide", IEEE Photonics Technology Letters, vol. 5, No. 2, Feb. 1993, New York US, pp. 191–194.

Williams et al, "Broad Bandwidth Highly Reflecting Gratings Formed in Photosensitive Boron Codoped Fibres", delivered orally to ECOC '92 (European Conference for Optical Communications) on Sep. 27, 1992 in Berlin, pp. 1–4.

"All–fibre Narrowband Reflection Gratings at 1500 nm", Electronics Letters, 24 May 1990, vol. 26, No. 11, pp. 729–731.

"Phase–Shifted Moiré Grating Fibre Resonators", Electronics Letters, 4 Jan. 1990, vol. 26, No. 1, pp. 10–12.

"Formation of Moiré Grating in Core of Germanosilicate Fibre By Transverse Holographic Double Exposure Method", Electronics Letters, 10 Oct. 1991, vol. 27, No. 21, pp. 1945–1947.

Mollenauer et al, "Wavelength Division Multiplexing With Solitons in Ultra–Long Distance Transmission Using Lumped Amplifiers", Journal of Lightwave Technology, vol. 9, No. 3, Mar. 1991, pp. 362–367.

Evangelides, Jr., et al, "Polarization Multiplexing with Solitons", Journal of Lightwave Technology, vol. 10, No. 1, Jan. 1992, pp. 28–35.

Wright et al, "Constraints on the Design of Long–Haul Soliton Systems", Nonlinear Guided Wave Phenomena, Sep. 2–4, 1991, Cambridge, UK, pp. 6–9.

"Mode–Locked Erbium Laser With Wavelength Selection By Means of Fibre Bragg Grating Reflector", Electronics Letters, 24 Oct. 1991, vol. 27, No. 22, pp. 2087–2088.

Kashyap, "Photosensitive Phenomenon in Optical Fibres", Paper Presented at the SPIE Conference on Emerging Optoelectronic Technologies, Bangalore, India, 18–20 Dec., 1991, SPIE 1622, pp. 1–15.

"Demonstration of Error–Free Soliton Transmission at 2.5 Gbit/s Over More Than 14000 km", Electronics Letters, 24 Oct. 1991, vol. 27, No. 22, pp. 2055–2056.

Mollenauer et al, "Demonstration of Error–Free Soliton Transmission Over More that 15000 km AT 5 Gbit/s, Single–Channel, and Over More Than 11000 km AT 10 Gbit/s in Two–Channel WDM", Electronics Letters, 9 Apr. 1992, vol. 28, No. 8, pp. 792–794.

Mocozzi et al, "Soliton transmission Control", Optics Letters, Dec. 1, 1991, vol. 16, No. 23, pp. 1841–1843.

Gordon et al, "Random Walk of Coherently Amplified Solitions in Optical Fiber Transmission", Optics Letters, Oct. 1986, vol. 11, No. 10, pp. 665–667.

Kodama et al, "Generation of Asymptotically Stable Optical Solitons and Suppression of the Gordon–Haus Effect", Optics Letters, Jan. 1, 1992, vol. 17, No. 1, pp. 31–33.

"Photoinduced Refractive–Index Changes in $TiO_2$–Doped Silica Optical Waveguides on Silicon Substrate", Electronics Letters, 21 Nov. 1991, vol. 27, No. 24, pp. 2294–2295.

"Mode–Locked Erbium Fibre Laser With Wavelength Selection by Means of Fibre Bragg Grating Reflector", Electronics Letters, 24 Oct. 1991, vol. 27, No. 22, pp. 2087–2088.

Morey et al, "Fiber Optic Bragg Grating Sensors", SPIE, vol. 1169, Fiber Optic and Laser Sensors VII (1989) [no month].

Hibino et al, "Optical Frequency Tuning by Laser–Irradiation in Silica–Based Mach–Zehnder–Type Multi/Demultiplexers", IEEE Photonics Technology Letters, vol. 3, No. 7, Jul. 1991, pp. 640–642.

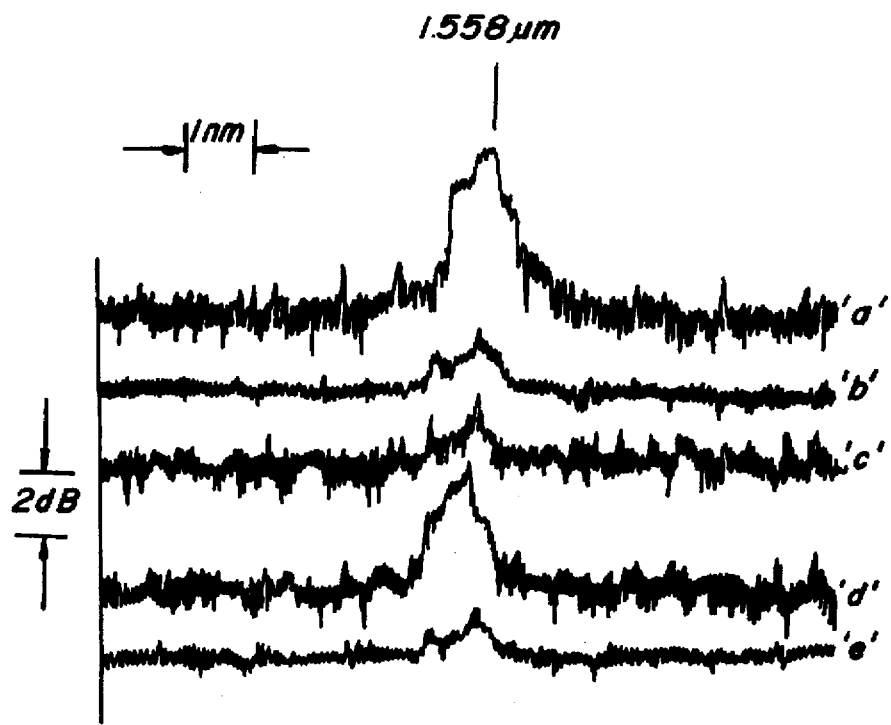
FIG. 6
FIG. 7
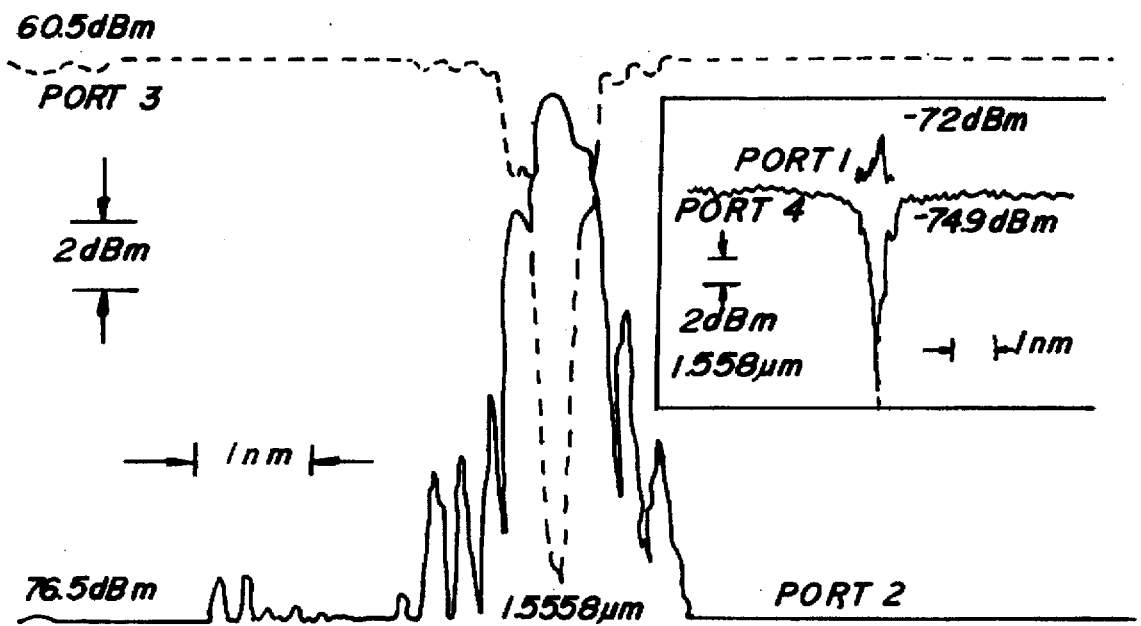

METHOD FOR CUSTOMIZING OPTICAL DEVICE CONFIGURATION AFTER PACKAGING AND PACKAGED OPTICAL DEVICE FOR USE THEREWITH

BACKGROUND OF THE INVENTION

1. Field of the Invention

This invention relates to the packaging of optical devices, and in particular to the packaging of optical devices which are photosensitive.

2. Related Art

Photosensitive optical devices have been known for a large number of years, and in the case of photosensitive optical fibres, for over twenty years. For example, in 1978 Hill et al reported the optical writing of a Bragg reflection grating into an optical fibre core. Hill K O, Fujii Y, Johnson D C & Kawasaki B S, "Photosensitivity in optical fibre waveguides: Application to reflection filter fabrication", Appl Phys Lett, 32 (10), 647–649, 15 May 1978.

There are many applications of photosensitive optical devices, particularly in the fields of telecommunications and sensing, as demonstrated by the following publications:

Hill K O, Malo B, Vineberg K A, Bilodeau F, Johnson D C and Skinner I, "Efficient mode conversion in telecommunication fibre using externally written gratings", Electron Lett 26 (16), 1270, 1990.

Morey W W, Meltz G and Glenn W H, "Fiber optic Bragg grating sensors", SPIE 1169, Fiber and Optic and Laser Sensors VII 1989, pp 98–107.

Park H G and Park B Y, "Inter-modal coupler using permanently photo-induced grating in two-mode optical fibre", Electron Lett 25 (12), 797, 1989.

Ball G A, Morey W W and Waters J P, "$Nd^{3+}$ fibre laser utilising intra-core Bragg reflectors", Electron Lett 26 (21), 1829, 1990.

Bird D M, Armitage J R, Kashyap R, Fatah R M A, K H, "Narrow line semiconductor laser using fibre grating", Electron Lett 27 (13), 1115, 1991.

"Formation of Bragg gratings in optical fibers by a transverse holographic method", G Meltz, W W Morey, and W H Glenn. "Optics Letters, Vol. 14, No. 15, 1st Aug. 1989, pages 823–825.

Davey R P, Smith K, Kashyap R, Armitage J R, "Mode-locked Er fibre laser with wavelength selection by means of a Bragg grating reflector", Electron Lett 27 22), 2087, 1991.

Many of these devices require some form of packaging before they can be used outside of a laboratory, for example for a telecommunications or sensing application. The purpose of the packaging may be to facilitate the input or output of electrical or optical signals to or from the device, and/or may be to provide protection to the device from the operating environment, e.g. from moisture, dust, temperature fluctuations etc.

Hitherto, photosensitive optical devices have been packaged in the same conventional manner as non-photosensitive optical devices. The present invention is based on the realisation that significant advantages can be gained by packaging photosensitive devices in a manner so as to allow optical radiation to reach the photosensitive part of the device after packaging.

SUMMARY OF THE INVENTION

According to a first aspect of the present invention there is provided a method of assembling a package comprising a container having a window substantially transparent to optical frequency electro-magnetic radiation, and a photosensitive optical device, the method comprising the steps of 1) mounting the optical device within the container, and then subsequently,
2) directing optical frequency electro-magnetic radiation to pass through the window in the container and impinge upon a photosensitive part of the optical device, and
3) allowing the electro-magnetic radiation to cause a semi-permanent change in the refractive index of the photosensitive part of the optical device.

According to a second aspect of the present invention there is provided a package comprising a container having a window substantially transparent to optical frequency electromagnetic radiation and a photosensitive optical device mounted within said container, so that optical frequency electromagnetic radiation passing through the window in the container may impinge upon a photosensitive part of said optical device, wherein the photosensitive part of the optical device is susceptible to a semi-permanent change in refractive index upon illumination by optical frequency electromagnetic radiation.

A semi-permanent change in refractive index is one which is not merely transient, but one which is effective for a substantial portion of the lifetime of the optical device. The semi-permanent change in the refractive index of the photosensitive part of the optical device may, however, be reversed and a further, perhaps different, semi-permanent change in the refractive index may be induced.

The ability to define the photosensitive aspects of the optical device's functions after the device has been mounted in a container allows the performance of a package comprising both the container and an optical device to be optimised.

Thus detrimental effects on the performance of the optical device due to mounting within the container may be taken into account and overcome when the photosensitive part of the optical device is subsequently exposed to optical frequency radiation passing through the window in the container. This is not possible when utilising conventional assembling methods and packages which do not allow the optical device to be illuminated by optical frequency radiation after packaging. If conventional packages and packaging techniques are employed the performance of the optical device must be optimised in isolation from the container, and no account can be taken of the, possibly unpredictable, effects of subsequently mounting the device in a container. This may result in the performance of the optical device within the container being optimum, but the performance of the optical device and container combination being non-optimum.

A further advantage provided by the present invention relates to the stocking of packaged photosensitive devices. If such devices are packaged in a conventional manner a manufacturer or user of the device must stock at least one device of a particular type, for example an optical source of a particular wavelength, for each perceived requirement. In some circumstances the number of different device types may be very great, for example for devices for use in a fine grain wavelength division multiplex optical communications system, several hundred optical sources of slightly different wavelength may be needed. Furthermore, despite a large stock holding of conventionally packaged optical devices a need may arise, for example from a customer requiring an optical source of a particular wavelength falling between the stocked wavelengths, which cannot be met, except by manufacturing and packaging an optical device specifically on demand. Thus resulting in a slow response to requests for particular device types, and, if manufacturing and packaging of the devices do not have high yields, in the need to manufacture and package more than the one device requested in order to ensure at least one working example is available.

Similar difficulties arise in stocking optical filters which are required to operate at a particular wavelength.

By utilising a method of assembly, and a package according to the present invention these problems are considerably ameliorated. A number of a generic type of optical device, packaged in a container according to the present invention, may be stocked prior to defining the photosensitive aspects of the device's function. When a particular device type is requested, for example a particular wavelength optical source or optical filter, one of the stocked devices may be selected, and by illuminating the photosensitive part of the optical device through the window in the container, the device may be configured to have precisely the characteristics required.

The present invention is particularly advantageous when the optical device to be packaged comprises two or more sub-assemblies (at least one of which has a photosensitive part) between which, in use, optical radiation is to be coupled. In this case if a prior art container not having a window is used the photo-sensitive sub-assembly must be exposed to optical radiation to define its function before it is mounted within the container, and thus before the degree of coupling between the two sub-assemblies is known. This presents particular difficulties when the performance of the optical device as a whole depends critically on both the degree of coupling between the two sub-assemblies and the function served by the photosensitive sub-assembly, as for example is the case when one sub-assembly is a semiconductor source of optical radiation and the other is a photosensitive optical fibre in which a reflection grating is to be written.

Additionally or alternatively the present invention is advantageous when the optical device to be packaged comprises an interferometer. An interferometer comprises at least one optical cavity whose optical path is crucial to the performance of the interferometer. Due to the mechanical and thermal stresses caused during the packaging process, the optical length of this optical path may be inadvertently changed during packaging. The present invention overcomes this problem by allowing the optical path length to be trimmed, after packaging of the optical device, by illuminating a photosensitive part of the optical device with optical frequency electro-magnetic radiation through the window in the container. Furthermore, optical characteristics of the interferometer, for example the wavelength of operation of a Mach-Zehnder filter, need only be determined after packaging of the interferometer.

BRIEF DESCRIPTION OF THE DRAWINGS

Embodiments of the present invention will now be described, by way of example only, with reference to the accompanying figures, in which:

FIG. 6 shows the output from Port 28 of the MZ interferometer of FIG. 5 at various stages of trimming, 'a' before trimming, 'b' after 0.8 seconds, 'c' after 1.6 seconds exposure of arm 24, 'd' after 0.04 seconds exposure of arm 25, 'e' after a total of 2.4 seconds exposure of arm 24, and FIG. 7 shows the outputs from the four ports of the MZ interferometer of FIG. 5 after the trimming process.

DETAILED DESCRIPTION OF EXEMPLARY EMBODIMENTS

The first embodiment of the present invention which will be described is an external-cavity semiconductor laser. The fabrication of this device involves two distinct stages, the first is the mounting of a semiconductor diode and a photosensitive fibre in a container according to the present invention, and the second is the writing of a reflective grating into the photosensitive fibre. The first stage of fabrication results in a generic, fully packaged device which is able to output optical radiation across the broad optical gain bandwidth of the semiconductor diode into a fibre pigtail. This device is an intermediate product which is fully protected from the environment, and which may be stored without undue care for periods of many years if so desired.

The second stage of fabrication of the external-cavity laser generally occurs when an order is received for a laser having a particular wavelength, and comprises writing a reflection grating at the precise pitch corresponding to the required wavelength into the photosensitive fibre by exposing it to ultra-violet radiation passed through the window in the container. The result of this second stage of fabrication is a laser having a narrow linewidth output which is centred on a wavelength determined by the reflection grating.

Figure 1:
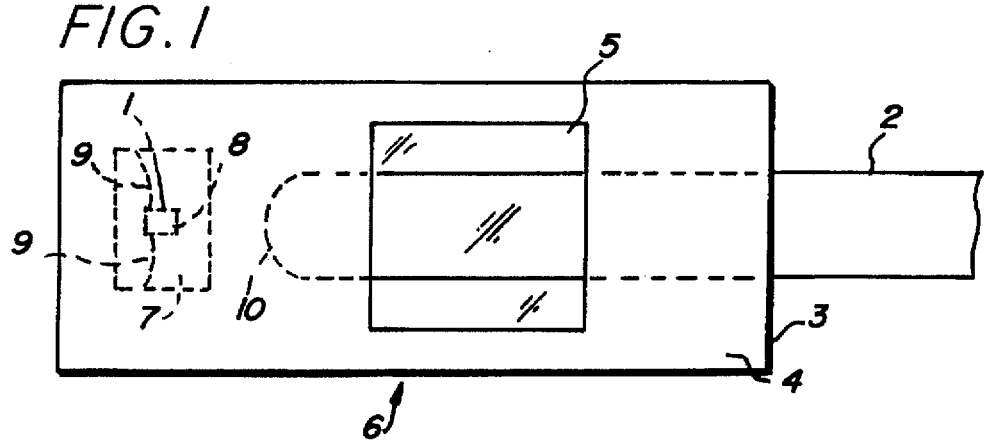
FIG. 1 shows a plan view of a first embodiment of the invention showing an external cavity semiconductor laser before grating writing.

FIG. 1 shows a laser diode 1 and a photosensitive optical fibre 2 mounted within a container having a body 3 and a lid 4 in which is provided a window 5 substantially transparent to UV radiation. The method of fabricating this intermediate product 6 will now be described.

A GaInAsP/InP buried hereto-structure laser diode is grown in a conventional manner by MOVPE, and one facet of the diode 8 is coated with multiple dielectric layers to reduce its reflectivity.

With reference to FIG. 1, the laser diode 1 is then mounted on a heat sink 7, so that its coated facet 8, when the diode is in use, emits radiation towards the fibre 2, and electrical contact is made with the diode via wire bonds 9.

Before the fibre 2 is mounted within the container 3, a lens 10 is formed at the end of the fibre.

Figure 2:
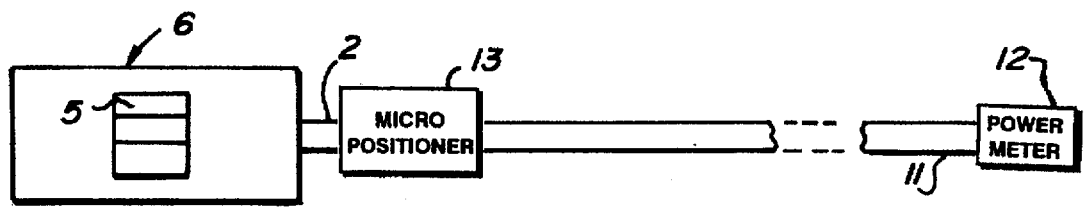
FIG. 2 shows an arrangement for monitoring the alignment of the fibre to the laser diode of FIG. 1.

In order to align the fibre 2 with the diode 1, the remote end 11 of the fibre 2 is coupled to an optical power meter 12 (shown in FIG. 2) and the diode 1 is powered via bond wires 9 so as to output a constant level of optical radiation. Micro-positioning equipment 13 is then used to manipulate the fibre 2 with respect to the diode 1 until a maximum power reading on the power meter 12 is achieved. At this point the fibre 2 is laser welded to the container 3, thus ensuring stable, low loss optical coupling between the diode 1 and the fibre 2.

The lid 4 is then hermetically sealed to the body 3 of the container, ensuring that the window 5 in the lid 4 is aligned above the fibre 2.

The window 5 is comprised of UV grade silica quartz which is substantially transparent to UV radiation. The window may alternatively be formed of any other material which is substantially transparent at the wavelength at which the grating is to be written. Preferably, the window 5 is also transparent at visible wavelengths so that the grating writing process may be viewed at visible wavelengths. The material of the window is optically flat on both sides, and is of high optical quality so as not to introduce distortion into an optical wavefront passing therethrough. The material of the window should have good thermal stability so as to avoid inhomogeneities if heating is caused by some absorbtion of UV radiation.

This completes the first stage of fabrication of the external cavity semiconductor laser, and the packaged intermediate product 6 may be stocked until required.

Figure 3:
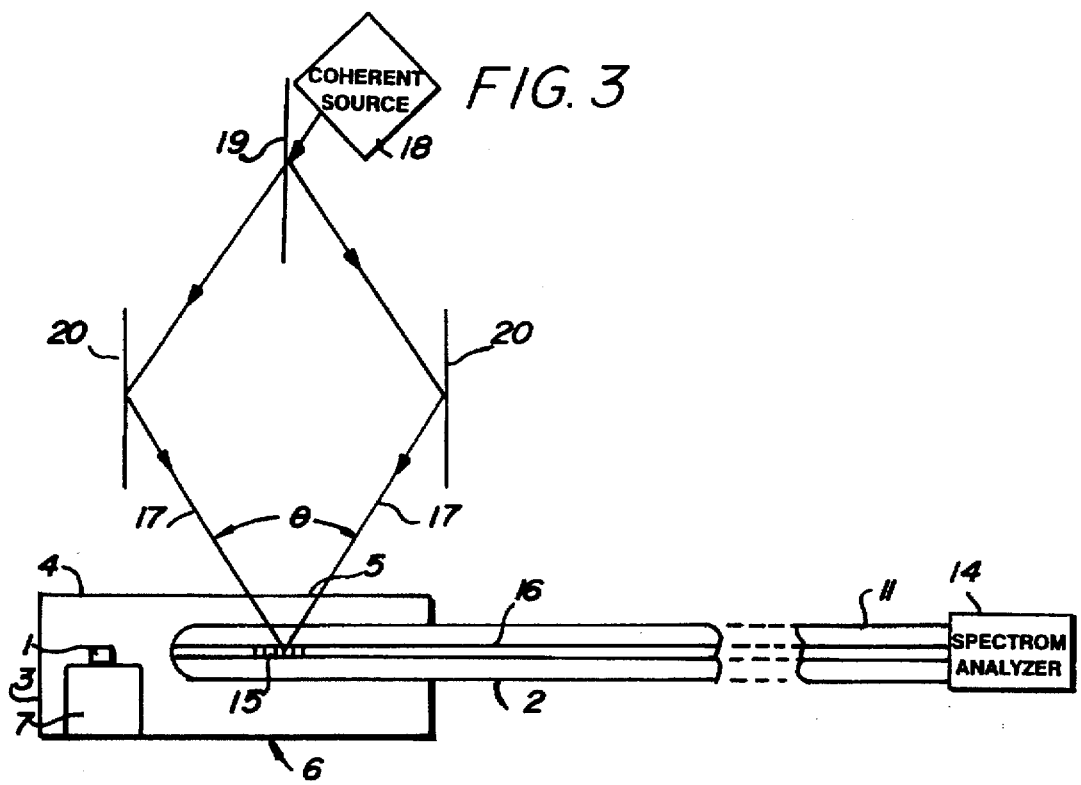
FIG. 3 shows an arrangement for writing a grating into the fibre of the embodiment of FIG. 1 through a window in a container, and a side elevation, in section of the container.

When a laser of a particular, preselected wavelength is required an intermediate product 6 is taken from stock and a reflection grating 15 at the appropriate pitch is written into the fibre 2 of the intermediate product. FIG. 3 shows the arrangement used for writing this grating 15. The end 11 of the fibre 2 remote from the intermediate product 6 is coupled to an optical spectrum analyser 14 so that both the level and spectrum of the radiation output from the laser can be monitored during the growth of the grating 15. In order to write the grating 15 a standing wave interference pattern is set up in the fibre core 16 by two suitably angled ultraviolet beams of radiation 17 derived from the same coherent source 18. The source 18 comprises an intra-cavity frequency doubled Ar$^+$ laser operating at 244 nm, chosen because of the sensitivity of the fibre 2 to this wavelength. It will be appreciated that other writing wavelengths can be used according to the variation in photosensitivity of the particular fibre used with writing wavelength.

The two UV beams 17 are produced by directing the output of the source 18 onto a beamsplitter 19 which produces two beams which are caused to converge on the fibre 2 by mirrors 20. It will be appreciated that the pitch of the resulting grating 15, and hence the wavelength of operation of the laser, will be determined by the angle θ at which the two beams 17 intersect one another. The pitch of the grating 15 can thus be adjusted by altering the angle θ, and is given by $$\Lambda = \frac{\lambda_1}{2\sin 1/2\theta}$$

where $\lambda_1$ is the wavelength of the source 18. The required preselected wavelength of operation $\lambda_B$ of the external cavity laser can then be achieved by choosing the pitch $\Lambda$ in accordance with $$\lambda_B = 2 n_e \Lambda$$

$n_e$ is the effective mode index of the mode guided by the fibre 2 and is easily calculated by the skilled person for any particular fibre 2 from a knowledge of the fibre refractive index profile.

The photosensitive fibre 2 may be a germania doped silica fibre fabricated in a non-oxidising atmosphere according to the method of GB 9205090.5 (application no. PCT/GB93/00462, publication no. WO93/18420) filed on 9 Mar. 1992. Alternatively the fibre may be co-doped with $B_2O_3$ in accordance with GB 92305783.0 (publication no. WO94/00784, application no. PCT/GB93/01321) filed on 24 Jun. 1992. It is also possible that a standard telecommunications optical fibre may have a sufficient level of photosensitivity to comprise the fibre 2. The skilled person in this field will be aware of the differing levels of photosensitivity available from different fibre designs and will select a fibre with a level of photosensitivity sufficient to achieve the required level of reflectivity from the reflection grating.

When utilising a CW power output from the source 18 of approximately 20 mW, and a Boron co-doped fibre, an exposure time of several minutes is required. During the start of this exposure period fine tuning of the grating pitch (by altering the angle θ) ensures that the precise preselected wavelength of the external cavity laser, as monitored by the spectrum analyser 14, is achieved. Once the wavelength of operation of the laser is equal to the preselected wavelength the interference field is maintained without further adjustment of the pitch of the grating 15.

Figure 4A:
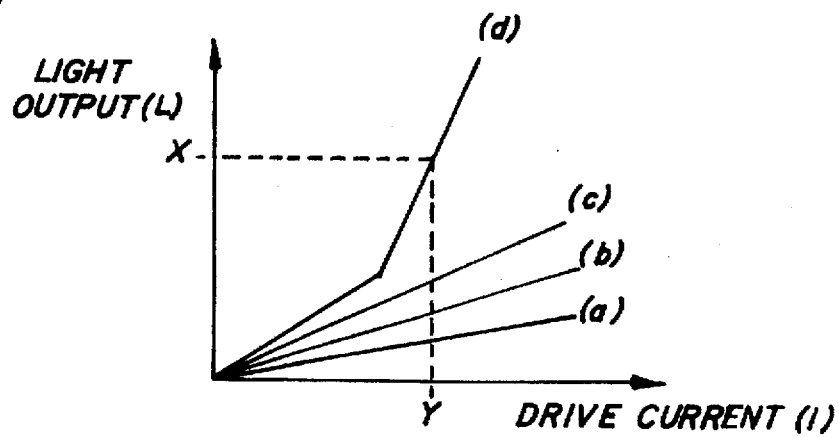
FIGS. 4a and 4b show the evolution of the L/I characteristic of the external cavity laser as the grating is grown in a, b, c and d, and the evolution of the output power at a fixed drive current in e.
Figure 4B:
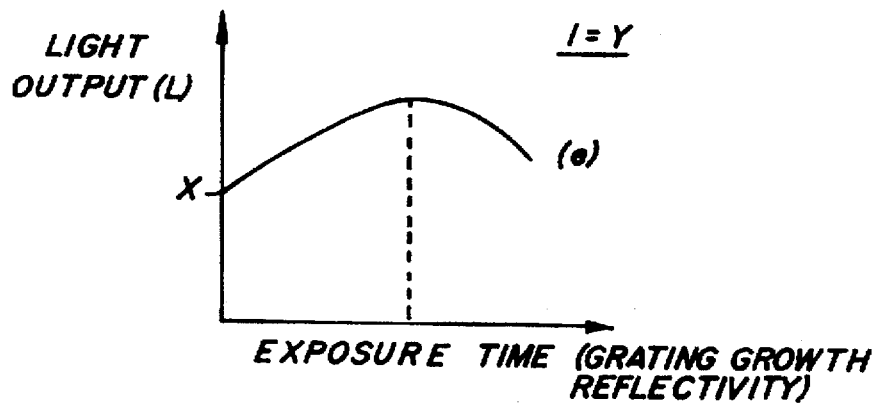

The precise exposure time of the fibre 2, and thus the level of reflectivity of the grating 15, is dependent on the characteristics required from the external cavity laser. If for example high output power is required for a given drive current then the reflectivity of the grating 15 is chosen so that optical feedback from the grating overcomes intra-cavity losses, for example coupling losses between the fibre 2 and the laser diode 1, while not being so high that it reduces the output power of the external cavity laser. This is achieved in the following manner. During the exposure time of the grating 15 the drive current to the laser diode 1 is repeatedly ramped from zero to the maximum value of drive current for the laser diode, and the output of the external cavity laser against the drive current is monitored. FIG. 4 shows a number of schematic L/I (light versus current) characteristics of the laser during the growth of the grating. FIG. 4a at (a) shows the L/I characteristic at the beginning of the exposure time when the grating 15 is providing very little feedback to the laser diode 1. As the grating 15 increases in reflectivity during the exposure time, it provides more feedback to the laser diode 1 and the L/I characteristic increases in gradient, as shown in FIG. 4a at (b) and (c). When the grating 15 provides sufficient feedback to overcome the intra-cavity losses, the external cavity laser reaches threshold and begins to lase. This is apparent from the formation of a knee in the L/I characteristic as shown in FIG. 4a at (d). Once this knee in the L/I characteristic is observed the drive current is no longer ramped, but is fixed at the desired operating current Y of the external cavity laser and the output of the laser at this driving current is then monitored. This output increases with time, as the reflectivity of the grating 15 continues to increase, towards a peak, as shown in FIG. 4b at (e). Stopping the exposure of the grating at this peak will result in an external cavity laser having an output power optimised to the chosen drive current. If the exposure of the grating is continued beyond this point the resulting higher level of feedback will cause the output of the laser to be reduced, as shown in FIG. 4b at (e).

It should be noted that neither the coupling loss between the fibre 2 and the grating 15, nor the level of reflectivity of the grating need be calculated, estimated, or measured, in contrast to prior art methods in which the grating is written before the fibre is aligned to the laser diode 1.

Since the grating 15 is written in the fibre 2 only after packaging in the container 3 there is no danger that the wavelength of operation of the grating will be altered for example by any stress caused to the fibre during laser welding and packaging. Furthermore the optimum reflectivity of the grating 15, to overcome coupling losses between the laser diode 1 and the fibre 2, while not being so high as to limit the output of the laser, can be achieved only through writing of the grating after packaging, when coupling losses are fixed.

It will be appreciated that desired characteristics, other than an optimised output power, may be achieved during the grating writing, which will require different aspects of the laser performance to be monitored. For example, a certain specified output power at a particular drive current may be required, or a particular laser linewidth, or threshold may be required.

A second embodiment of the present invention comprising a planar waveguide Mach Zehnder (MZ) band-pass filter will now be described.

Many telecommunications applications require the use of a band-pass rather than a band-stop filter. The band-stop characteristic of a reflection grating written into a photosensitive waveguide, as described above, can be transformed to a band-pass characteristic by incorporating an identical such reflection grating into each of the two arms of a balanced MZ interferometer.

The MZ band-pass filter is fabricated in two stages. The first stage of fabrication results in a balanced MZ interferometer packaged in a container according to the present invention. This intermediate product is then stored until a requirement for a band-pass filter of a particular wavelength and bandwidth arises. The second stage of fabrication comprises a first step of writing a grating into each of the two arms of the MZ, and a second step of trimming the interferometer to ensure that both arms are balanced. Both these steps are carried out by passing UV radiation through the window in the package.

Figure 5:
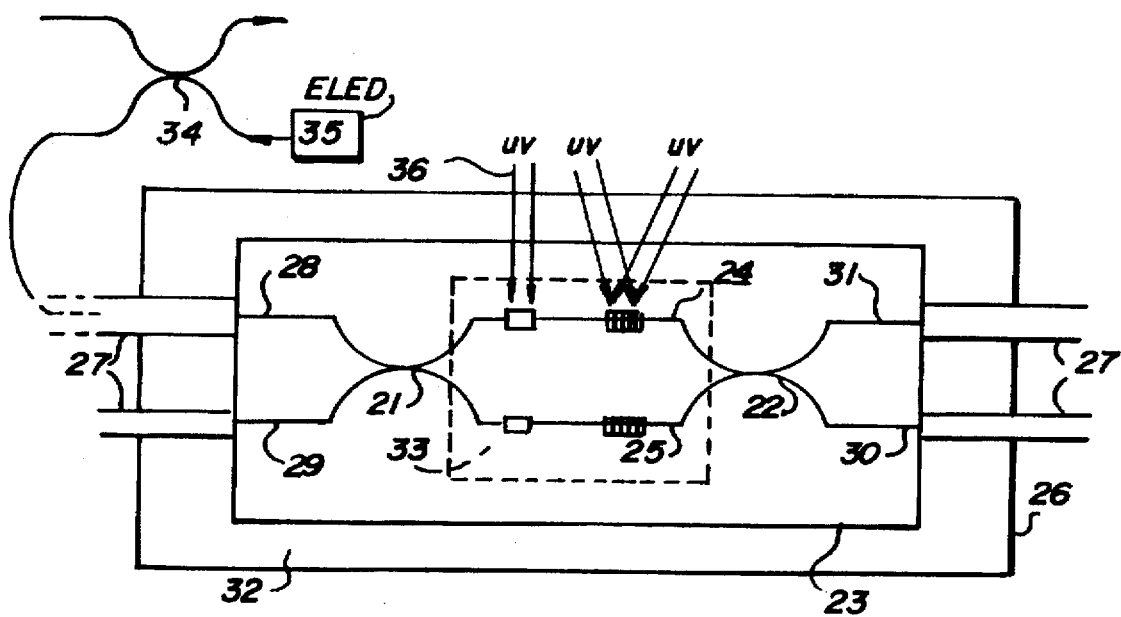
FIG. 5 is a schematic of a second embodiment of the invention showing a Mach-Zehnder (MZ) interferometer mounted in a container according to the present invention, and also showing the arrangement for the UV-exposure of the arms of the MZ interferometer, and the positions of the gratings and trimming regions.

With reference to FIG. 5 a balanced MZ interferometer is formed by fabricating two identical 50:50 waveguide couplers 21, 22, at 1555 nm, on the same substrate 23 using the well known flame hydrolysis technique. The output ports of the coupler 21 are joined to the input of the coupler 22, so forming two arms 24 and 25 of the MZ interferometer, each an being approximately 10 mm in length.

In order to achieve a balanced MZ structure these two arms 24 and 25 must be substantially of equal optical path length. The optical path length of each arm is affected by both the refractive index of the waveguide forming the arm and the physical length of the arm. Fluctuations in the refractive index of waveguides formed by flame hydrolysis, and thus of the effective mode index of optical frequencies guided by them are relatively small—being of the order of one percent of the effective mode index. These fluctuations are moreover in practise largely averaged over the length of each arm so that the physical differences in arm length are the major cause of differences in optical path length between the arms. Using photolithographic techniques, the physical length of the arms 24 and 25 can be defined to within a few microns, resulting in an optical path difference between the arms of less than a few wavelengths, and hence a balanced MZ structure.

After these waveguides have been formed in a conventional manner by the flame hydrolysis technique, they are subjected to a final hydrogenation process in accordance with PCT/GB93/00462 to ensure that they are photosensitive.

The substrate 23 is then mounted in the body 26 of a container and fibres 27 are aligned with each of the ports 28, 29, 30 and 31 of the MZ interferometer and laser welded to the body 26. A lid 32 having a window 33, transparent to UV radiation, is then laser welded to the body 26 of the container, ensuring that the window 33 is aligned above the arms 24, 25 of the MZ interferometer. This completes the first stage of fabrication, and the resulting intermediate product is stored.

When a band-pass filter is required at a particular wavelength and having a particular bandwidth pass-band, for example 1.5558 μm and 1 nm, an intermediate product is exposed to UV radiation to give a MZ band-pass filter having the desired characteristics. This second stage of fabrication comprises two steps. Firstly, an identical grating is written into each arm 24 and 25 of the MZ interferometer, and secondly the interferometer is trimmed so as to ensure it is still balanced and to maximise the performance of the filter.

The gratings are written, using the same apparatus previously described in relation to the first embodiment of the invention, into each arm 24, 25 of the interferometer, close to one of the couplers 22, as shown in FIG. 5. The pitch, length and depth of refractive index modulation of the gratings are chosen in conventional manner to give the desired band-pass characteristic i.e. centre wavelength, bandwidth and transmission coefficient.

Typical exposure times range between seconds to several minutes. Grating lengths are around 3 mm. The gratings are written by aligning the waveguides to the UV laser stripe while viewing under a microscope. Typical blue luminescence is observed when the Ge core is illuminated with UV radiation. It is estimated from previous writing times that the reflectivity of each grating is over 90%.

A fused tapered 3 dB fibre coupler 34 is spliced to the fibre 27, coupled to the port 28 of the MZ interferometer, to allow a broad bandwidth ELED (Edge-Emitting LED) 35, operating around a peak wavelength of 1550 nm, to be launched into the MZ, and, simultaneously, any back reflection from the MZ emerging from port 28 to be monitored.

TABLE 1

| PORT # | | % of total output power | |
|---|---|---|---|
| | | BEFORE TRIMMING | AFTER TRIMMING |
| 28 | Band-pass at 1.5558 μm | 54.3 [64.7] | 9.8 [13.3] |
| 29 | Looped Band-pass at 1.5558 μm | 24.6 [28.9] | 58.8 [80.3] |
| 30 | Band-stop minimum | 2.8 | 2.2 |
| 30 | Band-pass crossed | 70.7 | 70.7 |
| 31 | Band-pass through | 4.8 | 2.6 |
| 31 | Band-stop minimum | 0.13 | 0.08 |

(Note: Measurements are with reference to the power in the fibre at the input port 28: no allowance has been made for the coupling loss from the fibre to the waveguide at port 28. The transfer characteristics are therefore better than the quoted figures. The figures in brackets are relative to the total power appearing at the output ports 30 and 31. A fibre—fibre loss from port 28 to port 30 of 1.35 dB was measured.)

The four ports of the Mach-Zehnder are measured immediately after writing the two gratings. Table 1 shows the measured data at all four ports as a fraction of the power in the fibre at port 28. In order to make comparison of the signal in all four ports, each port has been referenced to the total power measured in the fibre offered to port 28. The launch efficiency into port 28 is not known exactly, however the power exiting ports 30 and 31 are known and thus the total insertion loss including propagation loss and launch efficiency can be inferred. Also, accurately known are the reflections of the gratings from the extinction measurements at the output ports 30 and 31. Since the exact power in the input waveguide is not known and the launch is not fully optimised, the final values include any propagation and coupling losses, and are worse than a true indication of the performance. The reflection from the gratings appears as a 'drop-out' (Band-stop) in the spectrum of port 30 at a wavelength of 1.5558 μm, the dip corresponding to a 95.5% reflection (13.5 dB rejection). The remaining wavelengths within the spectrum are transmitted an port 31 and appear as broad pass bands around the Band-stop with transmission of only 4.8% of the total power at the input. The peak reflected signal (the band-pass) in port 28 at 1.5558 μm is 54.3% of the total power at the input after allowing for the 3 dB loss of the coupler at port 28. Port 29 (the looped-through port) shows the reflection in band-pass with the peak transmission of 24.6% of the power at the input.

It is clear that the reflected signals from the interferometer are unbalanced at the input coupler 21 of the MZ since the desired band-pass output is required at port 29 rather than port 28. To remedy this, the MZ is trimmed by re-exposing one of the arms (say the arm 24) of the MZ to a single unmodulated beam of UV-radiation in the path immediately after the input coupler 21 to change the local refractive index 36, as shown in FIG. 5. The input port 28 is monitored in situ in order to minimise the reflection. The results of this exposure are shown in the sequence (a)–(c) in FIG. 6. The spectra shown are for increasing exposure, over a 2 mm region. It can be seen that in under two seconds of exposure, the light reflected in port 28 is reduced by approximately 5 dB. The effect of UV exposure of the other arm 25 for 0.04 seconds can be seen in FIG. 6 at (d). The reflected signal has gone up by more than 2 dB, showing that the change in coupling due to the previous exposure is being reversed. The final FIG. 6 at (e) shows the spectrum after re-exposure of the first arm for another ½ second.

The index change estimated from the change in coupling in 2.4 seconds of UV exposure in these measurements of the MZ is $-4.4 \times 10^{-4}$. The balanced MZ band-pass filter is then tested for transmission characteristics. The spectra from the four ports are shown in FIG. 7. The signal in port 28 has been reduced from 54.3% of the power in the fibre at port 28 to about 9.76%. The band-pass in the looped through port 29 signal has increased from 24.6% to 58.8%. The signal in port 31 has gone down from 4.8 to 2.8%. The latter split could not, in this case, be altered since the gratings are written close to one coupler and no space is available between the gratings and the coupler to alter the phase in one arm of the interferometer. The bandwidth of the band-stop/pass due to the grating is approximately 1 nm, in good agreement with the calculation from the exposed lengths.

Thus, it can be seen that, by employing a package having a UV transparent window, not only can the precise desired characteristics of a band-pass filter be achieved by a simple second fabrication stage, but the performance of the filter can also be optimised. Hence, demand for an infinite range of different filters can be met from a small stock of intermediate products packaged according to the present invention.

It will be appreciated that the method and package of the present invention find wide application within the telecommunications field, and can advantageously be employed, not only for the packaging of single optical devices, but also for the packaging of opto-electronic integrated circuits. Complex opto-electronic integrated circuits, implemented for example on planar silica substrates, comprising lasers, couplers, amplifiers and filters will benefit from the application of the present invention. In accordance with the present invention, the functionality of such integrated circuits could be defined after packaging to yield for example a multi-wavelength source or a wavelength comb generator.

Following the definition of the function the optical device, whether as an external cavity laser, a Mach-Zehnder filter or otherwise, it may be desirable to prevent further electromagnetic radiation from reaching the photosensitive part of the optical device e.g. by covering the window in the container with a light-proof paint or sticker.

I claim:

1. A method of fabricating a package comprising a container having a window substantially transparent to optical frequency electro-magnetic radiation, and a photosensitive optical device, the method comprising the steps of
   1) mounting the optical device within the container, and then subsequently,
   2) directing optical frequency electro-magnetic radiation to pass through the window in the container and impinge upon a photosensitive part of the optical device, and
   3) allowing the electro-magnetic radiation to cause a semi-permanent change in the refractive index of the photosensitive part of the optical device.

2. A method as claimed in claim 1, wherein during step 3) an aspect of the performance of the optical device is monitored.

3. A method as claimed in claim 1, wherein the optical frequency electro-magnetic radiation is caused to form an interference pattern on the photosensitive part of the optical device.

4. A method as claimed in claim 3, wherein the optical path length difference between interfering beams of the optical frequency electro-magnetic radiation is substantially smaller than the coherence length of the source of the electro-magnetic radiation.

5. A method as claimed in claim 1, wherein the optical frequency electro-magnetic radiation comprises laser radiation.

6. A method as claimed in claim 1, wherein the optical frequency electro-magnetic radiation causes a grating to be formed within the photosensitive part of the optical device.

7. A method as claimed in claim 1, wherein step 2) is repeated.

8. A method as claimed in claim 1, wherein the photosensitive optical device comprises a first and a second sub-assembly and said mounting step 1) comprises
   a) mounting the first sub-assembly in the container,
   b) aligning the second sub-assembly to the first sub-assembly so that, in use, optical frequency electromagnetic radiation is coupled from one sub-assembly to the other, and
   c) mounting the second sub-assembly in the container.

9. A method of fabricating a package comprising a container having a window substantially transparent to optical frequency electro-magnetic radiation, and a photosensitive optical device, the method comprising the steps of
   1) mounting the optical device within the container, and then subsequently,
   2) directing optical frequency electro-magnetic radiation to pass through the window in the container and impinge upon a photosensitive part of the optical device, and
   3) allowing the electro-magnetic radiation to cause a semi-permanent change in the refractive index of the photosensitive part of the optical device, and wherein the optical frequency radiation causes a change in the optical length of the photosensitive part of the optical device.

10. A method of fabricating a package comprising a container having a window substantially transparent to optical frequency electro-magnetic radiation, and a photosensitive optical device, the method comprising the steps of 1) mounting the optical device within the container, and then subsequently,
2) directing optical frequency electro-magnetic radiation to pass through the window in the container and impinge upon a photosensitive part of the optical device, and
3) allowing the electro-magnetic radiation to cause a semi-permanent change in the refractive index of the photosensitive part of the optical device, wherein step 2) is repeated, and
wherein the optical frequency electro-magnetic radiation causes a grating to be formed within the photosensitive part of the optical device, and then subsequently wherein the optical frequency radiation causes a change in the optical length of the photosensitive part of the optical device.

11. A method of assembling a laser package comprising a container having a window substantially transparent to optical frequency electro-magnetic radiation, a semiconductor source of optical radiation, and a photosensitive optical fibre, the method comprising the steps of i) mounting the semiconductor source of optical radiation in the container,
ii) aligning the photosensitive optical fibre within the container so that in use optical radiation from the semiconductor source is efficiently coupled to the optical fibre,
iii) mounting the optical fibre at a position within the container defined by step ii),
iv) writing a grating into the core of the optical fibre by causing optical frequency electro-magnetic radiation to pass through the window in the container and impinge upon the optical fibre.

12. A method of fabricating a balanced planar waveguide Mach-Zehnder optical filter, the method comprising the steps of:

i) mounting a substrate having a planar waveguide defined balanced Mach-Zehnder structure into a container having a window substantially transparent to optical frequency electro-magnetic radiation, and then subsequently,
ii) directing modulated optical frequency electro-magnetic radiation to pass through the window in the container and impinge upon each arm of the Mach-Zehnder structure so as to cause a grating to be written into each arm, and then
iii) directing modulated optical frequency electro-magnetic radiation through the window in the container to impinge upon one of the arms so as to cause a change in the optical length of this arm thereby to maintain a balanced Mach-Zehnder structure.

13. A package comprising a container having a window substantially transparent to optical frequency electromagnetic radiation and a photosensitive optical device mounted within said container, so that optical frequency electromagnetic radiation passing through the window in the container may impinge upon a photosensitive part of said optical device, wherein the photosensitive part of the optical device is susceptible to a semi-permanent change in refractive index upon illumination by optical frequency electromagnetic radiation.

14. A package as claimed in claim 13, wherein the window in the container transmits at least 50% of the incident electro-magnetic radiation at a wavelength 240 nm.

15. A package as claimed in claim 13, wherein the window in the container transmits at least 90% of the incident electro-magnetic radiation at a wavelength of 240 nm.

16. A package as claimed in claim 13, wherein the optical properties of the window are such as to substantially prevent distortion of an optical wavefront passing therethrough.

17. A package as claimed in claim 13, wherein the optical device comprises an interferometer.

18. A package as claimed in claim 13, wherein the optical device comprises two or more sub-assemblies mounted within the container so as, in use, to facilitate coupling of optical radiation from one sub-assembly to another, and wherein at least one sub-assembly comprises the said photosensitive part of the optical device.

19. A package as claimed in claim 18, wherein one sub-assembly comprises a source of optical radiation and another sub-assembly comprises an optical waveguide.

20. A package as claimed in claim 19, wherein the optical waveguide is a photosensitive optical fibre.

21. A package as claimed in claim 20, wherein the optical fibre comprises a grating, and the source of optical radiation comprises a semiconductor laser the closest facet of which to the optical fibre is treated to reduce reflections therefrom.

22. A package as claimed in claim 19, wherein the optical waveguide is a photosensitive planar optical waveguide.

23. A package as claimed in claim 22, wherein the optical device comprises a planar waveguide optical filter.

24. A package as claimed in claim 23, wherein the filter is a balanced Mach-Zehnder band-pass filter.

25. A package comprising a container having a window substantially transparent to optical frequency electromagnetic radiation, in which container are mounted a first and second sub-assembly, the first sub-assembly comprising a source of optical radiation and the second sub-assembly comprising a photosensitive optical waveguide aligned to receive optical radiation from the source, the optical waveguide comprising a wavelength selective optical feedback element for reflecting optical radiation, which element has been optically written into the waveguide by optical radiation passed through the window in the container.

26. A packaged optical device comprising:
an optical signal processing device having at least a portion thereof that exhibits a semi-permanent photosensitive optical signal processing property;
a hermetically sealed protective package containing said optical signal processing device and having hermetically sealed in/out signal/power supply conductors coupled to said optical device therewithin; and
an optical window hermetically sealed into said package and aligned with said photosensitive portion to permit entry of optical radiation for optically configuring the optical device to customize and change said semi-permanent photosensitive optical signal processing property of the device after it has already been hermetically sealed within said package, said optical radiation effecting a semi-permanent change in the optical signal processing property of the device.

27. A packaged optical device as in claim 26 wherein said optical device has a radiation-induced optical signal processing property semi-permanently effected via said window after the device has already been packaged.

28. A packaged optical device comprising:
an optical signal processing device hermetically sealed within a protective package having a radiation-transparent window aligned with a photosensitive optical signal processing component and having a radiation-induced changeable optical length effected in said component via said window after the device has already been packaged.

29. A method of fabricating a packaged optical device, said method comprising the steps of:

a) locating an optical device within a package housing, said device, having a semi-permanent optical signal processing parameter yet to be optically changed and semi-permanently configured, via a photo-sensitive component within a package housing, said component being located under a window adapted to pass optical signal processing semi-permanent parameter configuration determining optical radiation; and b) hermetically sealing said optical device within said package housing such that the photo-sensitive component remains thereafter semi-permanently configurable via said parameter configuration determining optical radiation, said parameter configuration determining optical radiation effecting a semi-permanent change in the optical signal processing parameter of the optical device.

30. A method of fabricating a packaged optical device comprising the steps of:

a) locating an optical device within a package housing, said device, having an optical signal processing parameter yet to be optically changed and configured, via a photo-sensitive component within a package housing, said component being located under a window adapted to pass optical signal processing parameter configuration determining optical radiation;

b) hermetically sealing said optical device within said package housing such that the photo-sensitive component remains thereafter configurable via said parameter configuration determining optical radiation; and c) configuring said processing parameter of the optical device in situ while hermetically sealed within said package housing by passing optical radiation through said window onto said photo-sensitive component.

* * * * *